(12) United States Patent
Cazzaniga et al.

(10) Patent No.: US 8,549,917 B2
(45) Date of Patent: Oct. 8, 2013

(54) MICROELECTROMECHANICAL GYROSCOPE WITH ENHANCED REJECTION OF ACCELERATION NOISES

(75) Inventors: Gabriele Cazzaniga, Rosate (IT); Luca Coronato, Corsico (IT); Giacomo Calcaterra, Inveruno (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 13/619,570

(22) Filed: Sep. 14, 2012

(65) Prior Publication Data

US 2013/0008251 A1 Jan. 10, 2013

Related U.S. Application Data

(63) Continuation of application No. 12/641,106, filed on Dec. 17, 2009, now Pat. No. 8,347,716.

(30) Foreign Application Priority Data

Dec. 23, 2008 (IT) .............................. TO2008A0981

(51) Int. Cl.
*G01C 19/56* (2012.01)
*H01G 7/00* (2006.01)

(52) U.S. Cl.
USPC ......................... 73/504.12; 361/278; 361/280

(58) Field of Classification Search
USPC .................. 73/504.12, 514.32; 361/278, 280
See application file for complete search history.

(56) References Cited

U.S. PATENT DOCUMENTS

| 5,447,068 | A * | 9/1995 | Tang .......................... 73/514.32 |
| 5,728,936 | A | 3/1998 | Lutz |
| 5,895,850 | A | 4/1999 | Buestgens |
| 6,230,563 | B1 | 5/2001 | Clark et al. |
| 6,250,156 | B1 | 6/2001 | Seshia et al. |
| 6,349,597 | B1 | 2/2002 | Folkmer et al. |
| 6,520,017 | B1 | 2/2003 | Schoefthaler et al. |
| 7,797,998 | B2 * | 9/2010 | Menard et al. ............. 73/514.32 |
| 2002/0183899 | A1 | 12/2002 | Wallner |
| 2002/0189351 | A1 | 12/2002 | Reeds et al. |

(Continued)

FOREIGN PATENT DOCUMENTS

| DE | 102007012163 A1 | 10/2007 |
| DE | 102006046772 A1 | 4/2008 |

(Continued)

OTHER PUBLICATIONS

Schofield, A.R. et al., "Multi-Degree of Freedom Tuning Fork Gyroscope Demonstrating Shock Rejection," IEEE Sensors 2007 Conference, Atlanta, Georgia, Oct. 28-31, 2007, pp. 120-123.

*Primary Examiner* — John Chapman, Jr.
(74) *Attorney, Agent, or Firm* — Seed IP Law Group PLLC (57) ABSTRACT

An integrated microelectromechanical structure is provided with a driving mass, anchored to a substrate via elastic anchorage elements and designed to be actuated in a plane with a driving movement; and a first sensing mass and a second sensing mass, suspended within, and coupled to, the driving mass via respective elastic supporting elements so as to be fixed with respect thereto in said driving movement and to perform a respective detection movement in response to an angular velocity. In particular, the first and the second sensing masses are connected together via elastic coupling elements, configured to couple their modes of vibration.

21 Claims, 9 Drawing Sheets

(56) References Cited

U.S. PATENT DOCUMENTS

| | | |
|---|---|---|
| 2002/0189352 A1 | 12/2002 | Reeds, III et al. |
| 2002/0189353 A1 | 12/2002 | Knowles et al. |
| 2002/0189354 A1 | 12/2002 | Durante et al. |
| 2003/0164040 A1 | 9/2003 | Willig et al. |
| 2004/0211257 A1 | 10/2004 | Geen |
| 2004/0211258 A1 | 10/2004 | Geen |
| 2005/0050954 A1 | 3/2005 | Chaumet et al. |
| 2005/0229703 A1 | 10/2005 | Geen et al. |
| 2006/0032310 A1 | 2/2006 | Merassi et al. |
| 2006/0112764 A1 | 6/2006 | Higuchi |
| 2006/0156812 A1 | 7/2006 | Kai-Cheng et al. |
| 2006/0272411 A1 | 12/2006 | Acar et al. |
| 2007/0055331 A1 | 3/2007 | Merfeld |
| 2007/0062282 A1 | 3/2007 | Akashi et al. |
| 2007/0131030 A1 | 6/2007 | Jeong et al. |
| 2008/0092652 A1 | 4/2008 | Acar |
| 2008/0115562 A1 | 5/2008 | Haino et al. |
| 2008/0190200 A1 | 8/2008 | Caminada et al. |
| 2008/0276706 A1 | 11/2008 | Hartmann et al. |
| 2009/0064780 A1 | 3/2009 | Coronato et al. |
| 2009/0100930 A1 | 4/2009 | Coronato et al. |
| 2010/0116050 A1 | 5/2010 | Wolfram |
| 2010/0126269 A1 | 5/2010 | Coronato et al. |
| 2010/0126272 A1 | 5/2010 | Coronato et al. |
| 2010/0132463 A1 | 6/2010 | Caminada et al. |
| 2010/0186507 A1 | 7/2010 | Günthner et al. |
| 2010/0236327 A1 | 9/2010 | Mao |
| 2010/0281977 A1 | 11/2010 | Coronato et al. |
| 2010/0307243 A1 | 12/2010 | Prandi et al. |
| 2011/0030473 A1 | 2/2011 | Acar |
| 2011/0061460 A1 | 3/2011 | Seeger et al. |
| 2011/0154898 A1 | 6/2011 | Cazzaniga et al. |
| 2012/0060604 A1 | 3/2012 | Neul et al. |

FOREIGN PATENT DOCUMENTS

| | | |
|---|---|---|
| DE | 102007054505 A1 | 5/2009 |
| EP | 1 619 471 A1 | 1/2006 |
| EP | 1 624 286 A1 | 2/2006 |
| EP | 1 832 841 A1 | 9/2007 |
| JP | 20052411500 A | 9/2005 |
| WO | 2006/043890 A1 | 4/2006 |
| WO | 2007/086849 A1 | 8/2007 |
| WO | 2007/145113 A1 | 12/2007 |
| WO | 2009/033915 A1 | 3/2009 |
| WO | 2009/087858 A1 | 7/2009 |

\* cited by examiner

MICROELECTROMECHANICAL GYROSCOPE WITH ENHANCED REJECTION OF ACCELERATION NOISES

BACKGROUND

1. Technical Field

The present disclosure relates to a microelectromechanical structure, in particular a gyroscope sensitive to yaw angular accelerations, having enhanced mechanical characteristics, in particular in the rejection of acceleration noise.

2. Description of the Related Art

As is known, micromachining techniques enable manufacturing of microelectromechanical structures or systems (MEMS) within layers of semiconductor material, which have been deposited (for example, a layer of polycrystalline silicon) or grown (for example, an epitaxial layer) on sacrificial layers, which are removed by chemical etching. Inertial sensors, accelerometers, and gyroscopes built using this technology are having a growing success, for example, in the automotive field, in inertial navigation, or in the sector of portable devices.

In particular, known to the art are integrated gyroscopes made of semiconductor material built using MEMS technology.

These gyroscopes operate on the basis of the theorem of relative accelerations, exploiting the Coriolis acceleration. When an angular velocity is applied to a mobile mass that moves with a linear velocity, the mobile mass "feels" an apparent force, referred to as the "Coriolis force", which determines a displacement in a direction perpendicular to a direction of the linear velocity and to an axis about which the angular velocity is applied. The mobile mass is supported via springs that enable its displacement in the direction of the apparent force. On the basis of Hooke's law, the displacement is proportional to the apparent force so that, from the displacement of the mobile mass, it is possible to detect the Coriolis force and a value of the angular velocity that has generated it. The displacement of the mobile mass can, for example, be detected capacitively, by determining, in resonance conditions, capacitance variations caused by movement of mobile electrodes, which are fixed with respect to the mobile mass and are comb-fingered with fixed electrodes.

Published U.S. Patent Application Nos. US2007/0214883, US2009/0064780, and US2009/0100930, filed by the present applicant, disclose a microelectromechanical integrated sensor with rotary driving movement and sensitive to yaw angular velocities.

The microelectromechanical sensor comprises a single driving mass, anchored to a substrate and actuated with rotary motion. Through openings are provided within the driving mass, and corresponding sensing masses are set in the through openings; the sensing masses are enclosed within the overall dimensions of the driving mass, are suspended with respect to the substrate, and are connected to the driving mass via flexible elements. Each sensing mass is fixed with respect to the driving mass during the rotary motion, and has a further degree of freedom of movement as a function of an external stress, in particular a Coriolis force, acting on the sensor. The flexible elements, thanks to their particular construction, enable the sensing masses to perform a linear movement of detection in a radial direction belonging to the plane of the sensor, in response to a Coriolis acceleration. This movement of detection is substantially uncoupled from the actuation movement of the driving mass. The microelectromechanical structure, in addition to being compact (in so far as it envisages a single driving mass enclosing in its overall dimensions a number of sensing masses), enables, with minor structural modifications, a uniaxial gyroscope, a biaxial gyroscope, or a triaxial gyroscope (and/or possibly an accelerometer, according to the electrical connections implemented) to be obtained, at the same time ensuring an excellent uncoupling of the driving dynamics from the detection dynamics.

Figure 1:
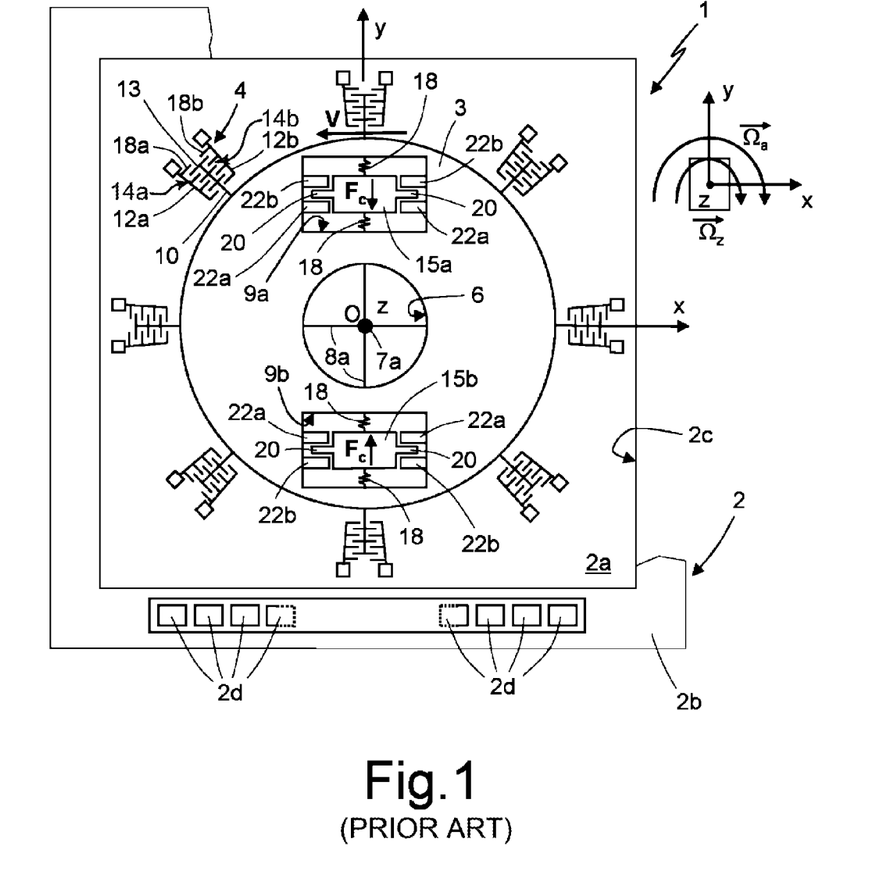
FIG. 1 shows a schematic top plan view of a microelectromechanical gyroscope, of a known type.

FIG. 1 shows an exemplary embodiment of a uniaxial microelectromechanical gyroscope, designated by 1, provided according to the teachings contained in the aforesaid patent applications.

The gyroscope 1 is provided in a die 2, comprising a substrate 2a made of semiconductor material (for example, silicon), and a frame 2b; the frame 2b defines inside it an open region 2c, which overlies the substrate 2a and is designed to house detection structure of the gyroscope 1 (as described in detail hereinafter). The open region 2c has a generally square or rectangular configuration in a horizontal plane (in what follows, plane of the sensor xy), defined by a first horizontal axis x and by a second horizontal axis y, which are fixed with respect to the die 2; the frame 2b has sides substantially parallel to the horizontal axes x, y. Die pads 2d are arranged along one side of the frame 2b, aligned, for example, along the first horizontal axis x. In a way not illustrated, the die pads 2d enable the detection structure of the gyroscope 1 to be electrically contacted from the outside.

The gyroscope 1 comprises a driving structure, housed within the open region 2c and formed by a driving mass 3 and by a driving assembly 4.

The driving mass 3 has, for example, a generally circular geometry with radial symmetry, with a substantially planar configuration with main extension in the plane of the sensor xy, and negligible dimension, with respect to the main extension, in a direction parallel to a vertical axis z, forming with the first and second horizontal axes x, y a set of three orthogonal axes, fixed with respect to the die 2. The driving mass 3 defines at a central empty space 6, a center O of which coincides with the centroid and a center of symmetry of the entire structure.

The driving mass 3 is anchored to the substrate 2a by means of a first anchorage 7a set at the center O, to which it is connected through first elastic anchorage elements 8a. The driving mass 3 is possibly anchored to the substrate 2a by means of further anchorages (not illustrated), set outside the same driving mass 3, to which it is connected by means of further elastic anchorage elements (not illustrated), for example, of the folded type. The first and further elastic anchorage elements enable a rotary movement of the driving mass 3 about an axis of actuation passing through the center O, parallel to the vertical axis z and perpendicular to the plane of the sensor xy, with a driving angular velocity $\vec{\Omega}_a$.

The driving mass 3 has a pair of through openings 9a, 9b, aligned in a radial direction, for example, along the second horizontal axis y, and set on opposite sides with respect to the empty space 6; the through openings 9a, 9b have in plan view a substantially rectangular shape, with main extension in a direction transverse to the radial direction.

The driving assembly 4 comprises a plurality of driven arms 10, extending externally from the driving mass 3 in a radial direction and arranged at equal angular distances apart, and a plurality of first and second driving arms 12a, 12b, extending parallel to, and on opposite sides of, respective driven arms 10. Each driven arm 10 carries a plurality of first electrodes 13, extending perpendicular to, and on both sides of, the same driven arm 10. Furthermore, each of the first and second driving arms 12a, 12b carries respective second electrodes 14a, 14b, extending towards the respective driven arm 10, and comb-fingered with the corresponding first electrodes 13.

The first driving arms 12a are set all on one side of the respective driven arms 10, and are all biased at a first voltage; likewise, the second driving arms 12b are all set on the opposite side of the respective driven arms 10, and are all biased at a second voltage. A driving circuit (not illustrated) is connected to the second electrodes 14a, 14b to apply the first and second voltages and determine, by means of mutual and alternating attraction of the electrodes, an oscillatory rotary motion of the driving mass 3 about the driving axis, at a given oscillation frequency and driving angular velocity $\vec{\Omega}_a$.

The gyroscope 1 further comprises a pair of acceleration sensors with axis parallel to the aforesaid radial direction, and in particular a pair of sensing masses 15a, 15b housed within the through openings 9a, 9b; the sensing masses 15a, 15b have, for example, a generally rectangular shape with sides parallel to corresponding sides of the through openings 9a, 9b, are suspended with respect to the substrate 2a, and are connected to the driving mass 3 via elastic supporting elements 18. The elastic supporting elements 18 depart, for example, from the opposite major sides of each sensing mass in a radial direction. In particular, the elastic supporting elements 18 are rigid with respect to the motion of actuation of the driving mass 3 (in such a way that the sensing masses 15a, 15b will follow the driving mass 3 in the rotary movement), and also enable a linear movement of the respective sensing masses in the aforesaid radial direction. Furthermore, mobile electrodes 20 are coupled to the second sensing masses 15a, 15b, extending, for example, from respective minor sides, in a direction orthogonal to the radial direction; the mobile electrodes 20 form sensing capacitors with plane and parallel plates with respective first and second fixed electrodes 22a, 22b, anchored to the driving mass 3. In particular, each mobile electrode 20 forms a first sensing capacitor $C_1$ with a respective first fixed electrode 22a (for example, the radially more internal one with respect to the center O), and a second sensing capacitor $C_2$ with a respective second fixed electrode 22b (for example, the radially more external one with respect to the center O).

In use, the gyroscope 1 is able to detect an angular velocity $\vec{\Omega}_z$ (of yaw), acting about the vertical axis z. In particular, this angular velocity $\vec{\Omega}_z$ to be detected generates a Coriolis force $\vec{F}_C$ on the sensing masses 15a, 15b oriented in a radial direction (hence directed as a centripetal force acting on the same masses), causing displacement of the sensing masses and a capacitive variation of the corresponding sensing capacitors $C_1$, $C_2$. The value of the capacitive variation is proportional to the angular velocity $\vec{\Omega}_z$, which can thus be determined in a per-se known manner via a reading circuit, operating according to a differential scheme. In particular, appropriate connections are provided between the fixed electrodes 22a, 22b and the mobile electrodes 20 in such a way that the difference between electrical quantities correlated to the variations of the first and second sensing capacitors $C_1$, $C_2$ are amplified in a differential way.

In particular, in the presence of the Coriolis force due to a yaw angular acceleration acting on the structure, the sensing masses 15a, 15b move in phase opposition in the radial direction (in other words, they displace in opposite senses, or orientations, with respect to the radial direction) so that the differential reading electronics generates an amplified electrical output quantity. Instead, external accelerations acting on the structure in the radial direction (for example, accelerations due to environmental noise) cause a movement in phase of the sensing masses 15a, 15b, which consequently is not read by the reading electronics (given that it does not cause an appreciable output).

Basically, the external accelerations are ideally rejected automatically due to the differential reading. In fact, whereas the useful Coriolis signal tends to unbalance the sensing masses 15a, 15b in opposite radial directions, external accelerations determine variations with the same sign (or sense). By means of the difference between the detection signals generated by the two acceleration sensors it is thus possible to measure the Coriolis contribution and reject the spurious accelerations.

The rotary driving motion also generates a centrifugal acceleration, which acts upon the sensing masses 15a, 15b, substantially in a way similar to the aforesaid Coriolis acceleration (i.e., causing a displacement thereof in opposite directions). However, the centrifugal acceleration causes a contribution at output having a frequency that is twice that of the Coriolis acceleration, and can consequently be appropriately filtered by the reading electronics.

Even though the gyroscope described in the aforesaid patent applications represents a considerable improvement as compared to other structures of a known type, it is not altogether optimized from the standpoint of the electrical characteristics and noise immunity. In particular, in given real operating conditions, it is not perfectly immune to external accelerations (for example, noise accelerations), and also to the effects of the centrifugal acceleration acting on the structure on account of the rotary driving motion.

BRIEF SUMMARY

The present disclosure provides a microelectromechanical gyroscope structure having sensitivity to external acceleration noise and to centrifugal acceleration. The gyroscope structure includes a driving mass configured to be actuated in a plane with a driving movement; first and second elastic anchorage elements anchoring the driving mass to a substrate; and first and second elastic supporting elements. The structure also includes a first sensing mass and a second sensing mass suspended within said driving mass and respectively coupled to the driving mass via the first and second elastic supporting elements, respectively. The sensing masses are configured to move with said driving mass in said driving movement and re configured to perform respective detection movements in response to an angular movement of the driving mass. The structure further includes elastic coupling elements coupling the sensing masses to each other and configured to couple modes of vibration of the sensing masses.

BRIEF DESCRIPTION OF THE SEVERAL VIEWS OF THE DRAWINGS

For a better understanding of the present disclosure, preferred embodiments are now described, purely by way of non-limiting example and with reference to the attached drawings, wherein.

DETAILED DESCRIPTION

The present applicant has realized, and verified experimentally, that non-perfect immunity to external acceleration noise afflicting the previously described gyroscope can be attributed to possible process variations (spread), and in particular to possible differences in the mechanical characteristics of the sensing masses and of the corresponding elastic elements, which can derive from this spread.

Figure 2:
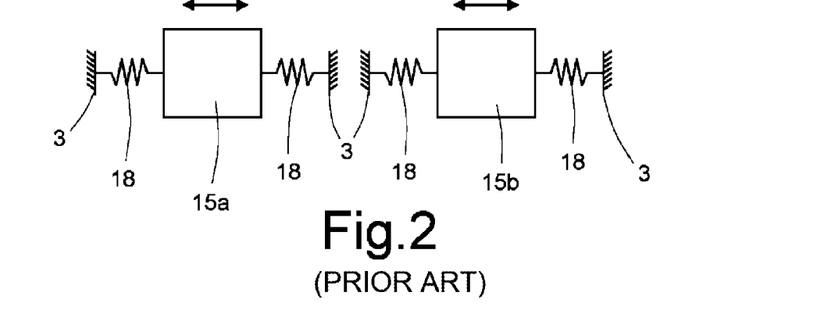
FIG. 2 is a schematic representation of the elastic connections of sensing masses of the gyroscope of FIG. 1.

In detail, as shown in FIG. 2 (where the elastic connections between the sensing masses 15a, 15b and the driving mass 3 through the elastic supporting elements 18 are represented schematically), the modes of vibration of the sensing masses 15a, 15b are uncoupled from one another and ideally are at the same frequency.

Due to the process spread, the resonance frequencies of the two sensing masses 15a, 15b may, however, not be perfectly coincident (for example, they may differ from one another by 10-20 Hz), and this causes, for high factors of merit Q, a poor rejection to the external acceleration noise. In fact, external accelerations having a frequency close to the resonance frequencies of the sensing masses 15a, 15b can generate responses considerably different in the two sensing masses, thus generating a non-zero output from the corresponding reading electronics (even though the differential scheme adopted is ideally able to reject these noises). Considering that the resonance frequency of the sensing masses has typical values in the region of 4-5 kHz, it is evident that also environmental noise with audio frequency can generate, for the reasons set forth above, even considerable output noises.

Figure 3A:
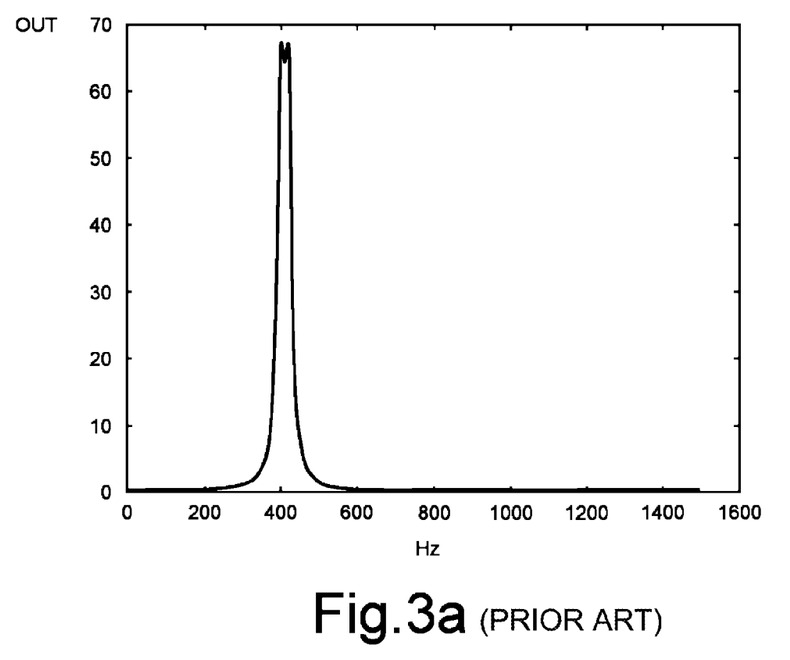
FIGS. 3a, 3b and 4a, 4b show plots of electrical quantities in the gyroscope of FIG. 1.
Figure 3B:
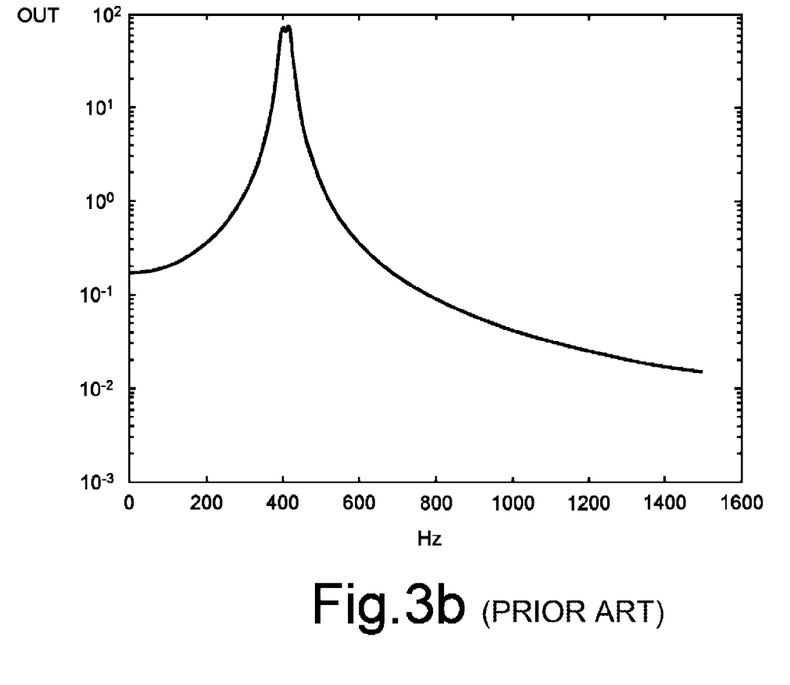
Figure 4A:
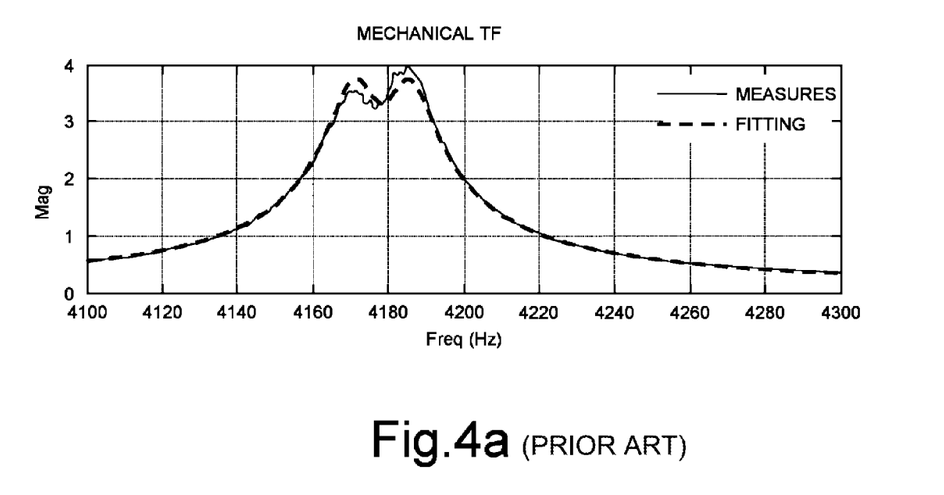
Figure 4B:
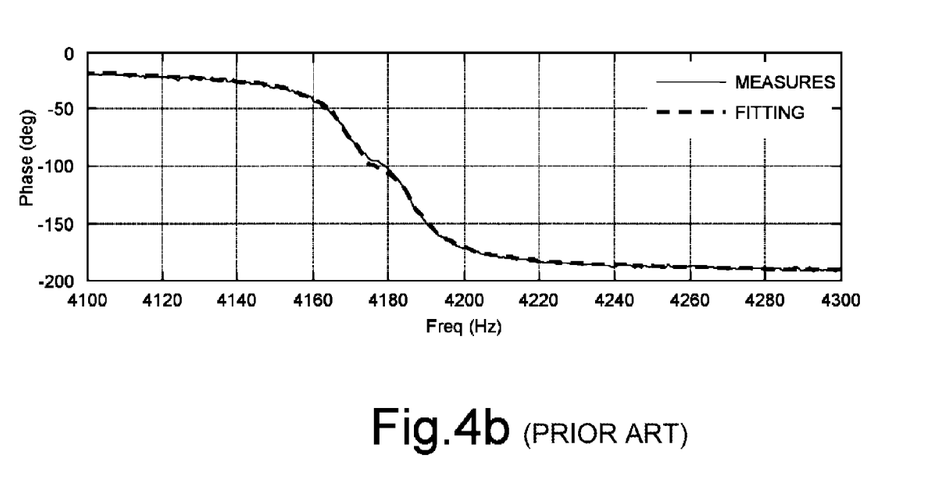

The above behavior has been verified by the present applicant by means of appropriate numerical simulations. FIGS. 3a and 3b show the results of numerical processing in which a process spread was simulated by applying a difference of 1% in the rigidity of the elastic supporting elements 18 associated to the sensing masses 15a, 15b, and a random displacement noise of the anchorage 7a (and of the possible further anchorages) of the driving mass was applied to simulate an external acceleration excitation. In particular, FIGS. 3a and 3b show, respectively, in linear and logarithmic scale, the output OUT of the reading electronics of the gyroscope 1 (and thus the result of the operations of amplification and demodulation of the signals at output from the sensing capacitors), whilst FIGS. 4a and 4b show, respectively, the magnitude (Mag) and the phase of the mechanical transfer function of the sensing masses 15a, 15b. These graphs highlight the presence of two distinct frequency peaks set at approximately 20 Hz apart, due to the different resonance frequencies of the two sensing masses 15a, 15b, and also the presence of a non-zero output from the reading electronics in the presence of noise acceleration (which could have values that can even be comparable with the values assumed during detection of angular accelerations).

To solve the aforesaid problems, one embodiment of the present disclosure envisages mechanical coupling (in particular via appropriate elastic elements) of the two sensing masses so as to couple their detection vibration modes.

In particular (reference may be made to FIG. 5, where the same reference numbers are used for designating elements similar to others already described previously), the microelectromechanical gyroscope, here designated by 30, differs from the gyroscope 1 of FIG. 1 substantially in that it comprises elastic coupling elements 32a, 32b designed to couple the sensing masses 15a, 15b elastically to one another.

Figure 5:
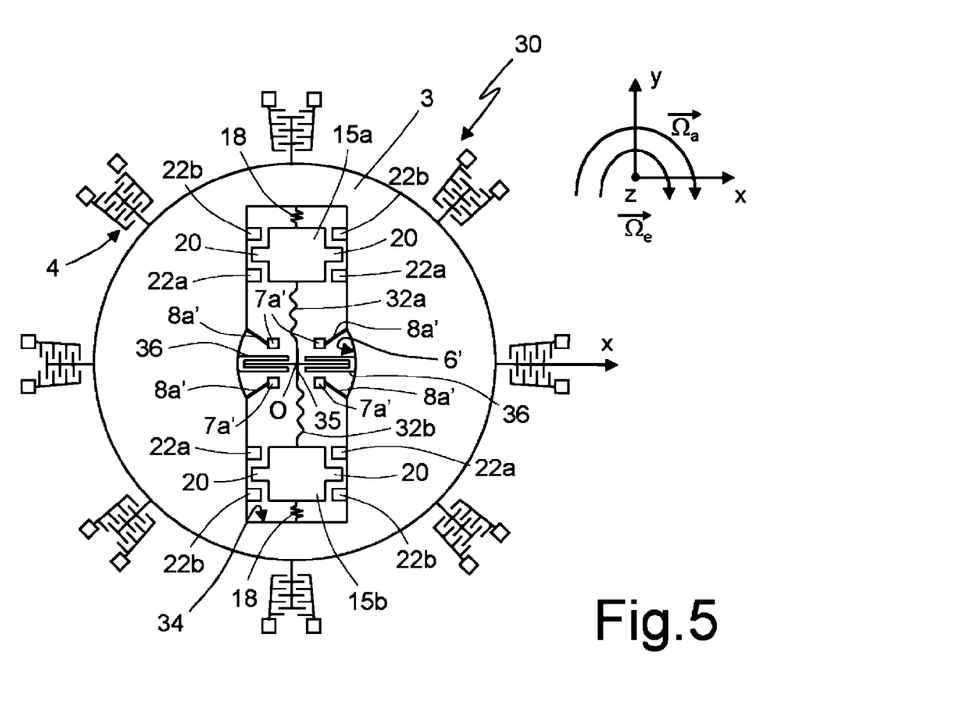
FIG. 5 shows a schematic top plan view of a microelectromechanical gyroscope according to a first embodiment of the present disclosure.

In this case, a single through opening is present, here designated by 34, also coinciding with the empty space, here designated by 6', defined at the center of the driving mass 3 (here having the shape of a circular frame). Located within the through opening 34 are both of the sensing masses 15a, 15b, and the various elastic elements designed to ensure coupling and mechanical support thereof via connection to the driving mass 3.

Figure 6:
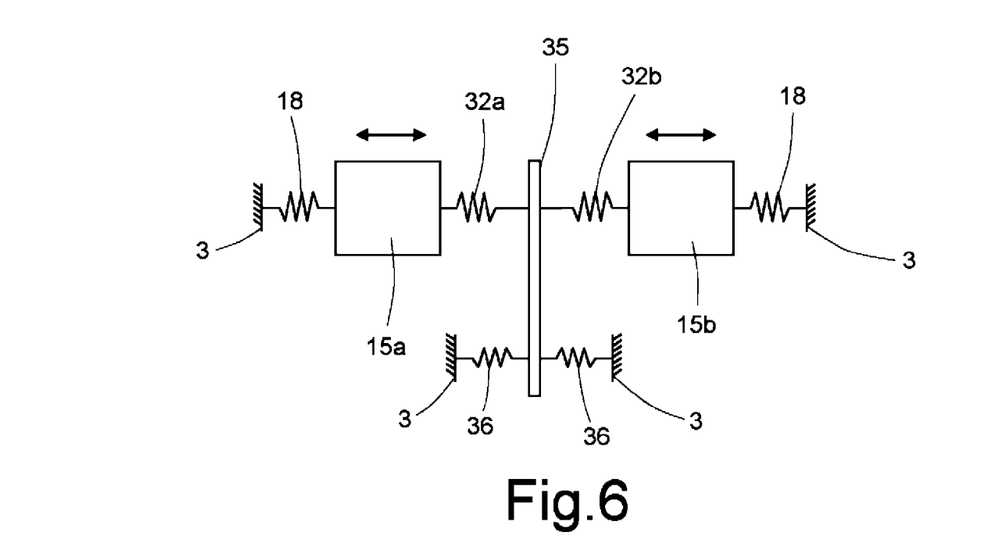
FIG. 6 is a schematic representation of the elastic connections of sensing masses of the gyroscope of FIG. 5.

In greater detail, the elastic coupling elements 32a, 32b are associated with each sensing mass 15a, 15b, respectively; the elastic coupling elements 32a, 32b depart, for example, from a major side of the respective sensing mass on an opposite side with respect to the elastic supporting elements 18 towards the center O(here just one elastic supporting element 18 is present for each sensing mass). The elastic coupling elements 32a, 32b are connected together via a connection body 35, set in a central position, for example, at the center O. The connection body 35 is configured so as to have substantially negligible weight and dimensions, in particular if compared with those of the same sensing masses and of the elastic elements. As shown in the schematic representation of FIG. 6, the connection body 35, in addition to being connected to the sensing masses 15a, 15b, is connected to the driving mass 3 via further elastic supporting elements 36. The further elastic supporting elements 36, for example, constituted by springs of a folded type, extend, for example, in a direction transverse to the radial direction of alignment of the sensing masses 15a, 15b (coinciding with the direction of extension of the elastic coupling elements 32a, 32b), at the center O. In particular, the further elastic supporting elements 36 operate to further constrain the sensing structure to the driving mass 3, in order to increase the rigidity of the sensing masses 15a, 15d with respect to translation along the vertical axis z.

In this case, the elastic anchorage elements of the driving mass 3 are moreover arranged in a different way within the empty space 6'. For example, four anchorages 7a' are provided, extending in pairs on either side of the further elastic supporting elements 36, to which the driving mass 3 is connected by means of respective elastic anchorage elements 8a', extending radially, in a way converging towards the center O.

The elastic coupling elements 32a, 32b have, in use, the function of coupling the movements of vibration of the sensing masses 15a, 15b, giving rise to two different separate vibration modes of the resulting mechanical sensing structure. In particular, a first vibration mode, in phase, and a second vibration mode, in phase opposition, are generated, having resonance frequencies that are clearly separate from one another. In both cases, the two sensing masses 15a, 15b vibrate at the same frequency. It is consequently convenient, by the reading electronics (here appropriately modified), to reject the in-phase vibration mode linked to the noise accelerations, and preserve, for the subsequent processing operations, just the vibration mode in phase opposition representing the angular accelerations to be detected. In particular, noise rejection is principally associated to a differential type reading, where the in-phase vibration mode does not generate a significant capacitive variation for the reading electronics.

Figure 7A:
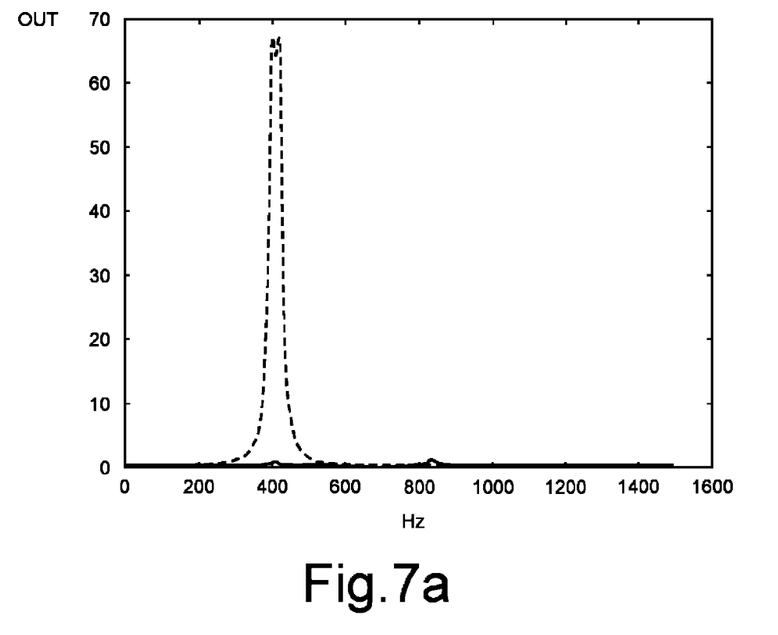
FIGS. 7a, 7b and 8a, 8b show plots of electrical quantities corresponding to the gyroscope of FIG. 5.
Figure 7B:
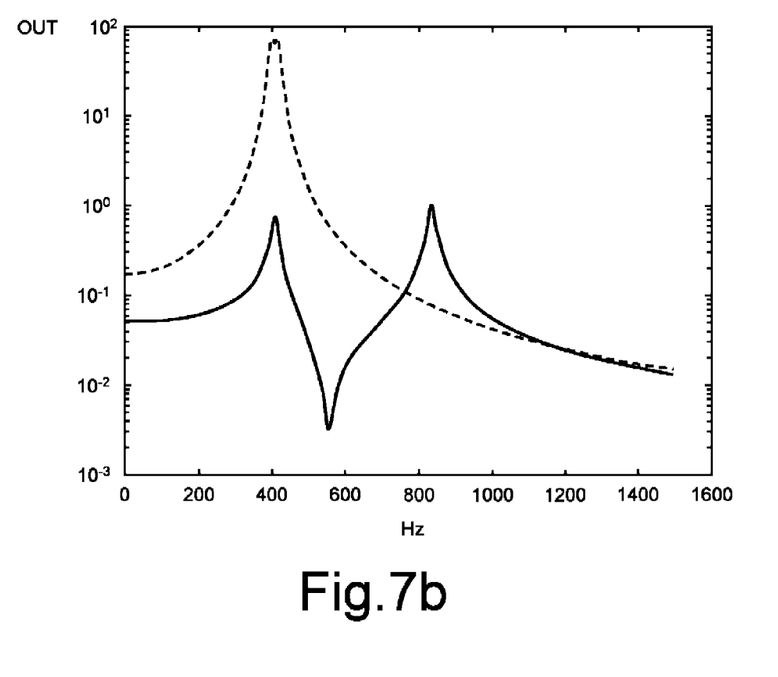

FIGS. 7a and 7b show the results of a numerical processing similar to the one previously described for the structure of a known type of FIG. 1, directly comparing the values obtained with the gyroscope 30 of FIG. 5 (represented with a solid line) and the values obtained with said structure of a known type (represented with a dashed line).

It may immediately be noted that coupling of the vibration modes of the sensing masses 15a, 15b generates at output (after appropriate demodulation with respect to the driving frequency) two contributions of noise at frequencies clearly separate from one another: one, corresponding to the in-phase vibration, has a frequency that is approximately twice that of the other, corresponding to the vibration in phase opposition. In particular, the frequencies of the two contributions of noise are the result of a difference between the corresponding resonance frequency (in phase, and in phase opposition) and the driving frequency.

Furthermore, it may immediately be noted that the aforesaid coupling enables a reduction in the output response of the gyroscope 30 to an external linear acceleration (for example, a noise acceleration) by approximately one hundred times as compared to a traditional solution.

Figure 8A:
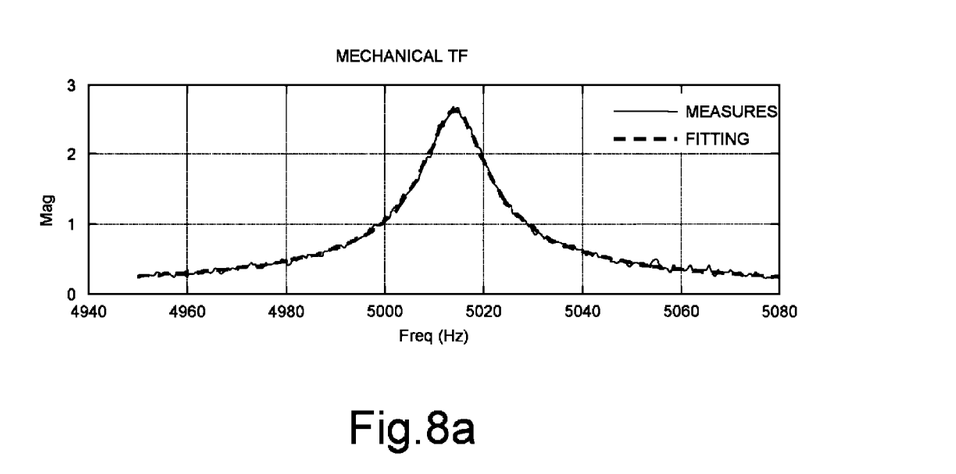
Figure 8B:
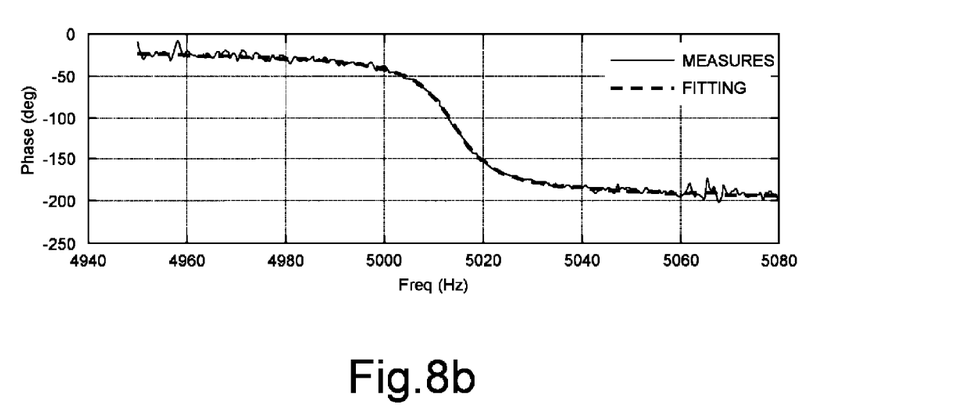

As is shown in FIGS. 8a and 8b, the mechanical system has a single peak, linked to the vibration mode in phase opposition, unlike solutions of a known type, which are characterized by a double peak in frequency.

It is consequently clear that the described embodiment enables a considerable improvement of the rejection of the linear-acceleration noises in the plane xy of the sensor. In particular, the frequencies of the two modes of vibration remain substantially unaltered in the presence of process spread, and moreover the differential type reading enables convenient elimination of the undesirable contribution of the in-phase vibration mode.

From the mechanical standpoint, the aforesaid two different vibration modes derive from the different displacement modalities of the sensing masses 15a, 15b, during the movement in phase or in phase opposition. In particular, during the movement in phase opposition, the displacement of the sensing masses 15a, 15b originates from the deformation both of the elastic coupling elements 32a, 32b and of the elastic supporting elements 18, so that the connection body 35 remains substantially still in a central position. During the in-phase movement, the elastic coupling elements 32a, 32b undergo a smaller deformation as compared to the movement in phase opposition, the elastic supporting elements 36 (which in the movement in phase opposition were substantially stationary) are also deformed, and the connection body 35 displaces in the radial direction.

The present applicant has, however, found that the gyroscope 30, albeit advantageously enabling rejection of noise linear accelerations, is not altogether free from problems due to the presence of the centrifugal acceleration. The rotation of the driving mass 3 generates in fact a centrifugal acceleration acting on the sensing masses 15a, 15b in opposite directions with respect to the radial direction of detection, and hence generates a vibration thereof in phase opposition (in a way similar to the effects of the Coriolis force linked to the yaw angular acceleration that is to be detected). As described in detail in the aforesaid European patent application filed in the name of the present applicant, it may be shown that the centrifugal acceleration causes a contribution of vibration at a frequency that is twice that of the acceleration to be detected so that ideally it is possible to filter its contribution.

However, the present applicant has verified that, in given operating conditions, the centrifugal acceleration, notwithstanding the presence of an adequate filtering stage, can cause a saturation of the amplification stages in the reading electronics, and thus cause in any case errors in the detection of angular accelerations.

In order to solve this problem, a further embodiment of the present disclosure envisages automatic compensation, via an appropriate geometrical configuration of the sensing structure, of the effects of the centrifugal acceleration (i.e., providing an intrinsic mechanical compensation, as an alternative, or in addition, to a compensation made at the reading electronics level).

Figure 9:
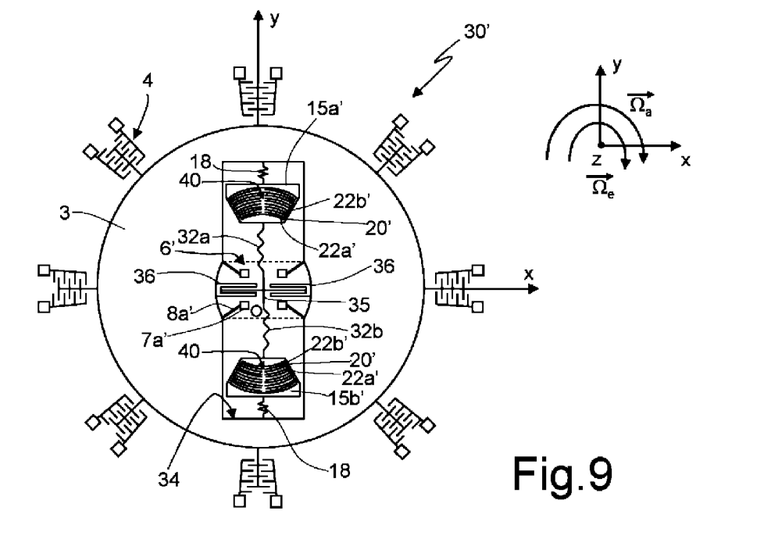
FIG. 9 shows a schematic top plan view of a second embodiment of the microelectromechanical gyroscope.

As is shown in FIG. 9, a second embodiment of the gyroscope, here designated by 30', differs from the one described previously substantially for a different conformation of the mobile and fixed electrodes, here designated by 20' and, respectively, 22a', 22b', and, in the case illustrated, of the sensing masses, here designated by 15a', 15b'.

In particular, this second embodiment envisages a suitable shaping of the mobile electrodes 20' and at least one between the respective first or second fixed electrode 22a', 22b', in such a way as to generate, during the rotary driving motion, a capacitive variation of the sensing capacitors able to compensate for a capacitive variation thereof due to the presence of the centrifugal acceleration.

In detail, the sensing masses 15a', 15b' have in this case a substantially trapezoidal conformation with a window 40 defined inside; mobile electrodes 20' and the corresponding fixed electrodes 22a' (radially more internal to the individual mobile electrode 20') and 22b' (radially more external to the individual mobile electrode 20') are arranged within the window 40. The window 40 has, in the plane of the sensor xy, the shape of an annulus sector, and the mobile electrodes 20' and fixed electrodes 22a', 22b' are substantially arc-shaped.

The mobile electrodes 20' extend inside the window 40, starting from oblique sides of the respective sensing mass 15a', 15b'. The first and second fixed electrodes 22a', 22b' associated to each mobile electrode 20' are set facing it on opposite sides, and are anchored to the substrate 2a via respective anchorages 42 (see FIG. 10), which are also arranged within the window 40. In particular, two sets of mobile electrodes 20' and corresponding first and second fixed electrodes 22a', 22b' are present, each set in a respective half into which the aforesaid window 40 is divided by the radial detection direction.

Figures 10, 11A, 11B:
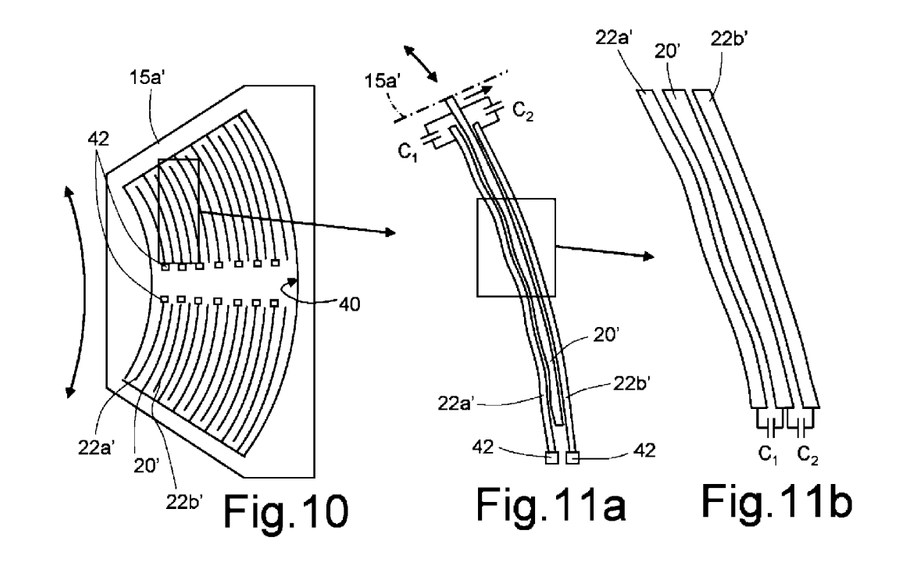
FIGS. 10, 11a, and 11b show progressive enlargements of portions of elements of the gyroscope of FIG. 9.

In greater detail, as illustrated in the progressive enlargements of FIGS. 10, 11a, and 11b, each mobile electrode 20' has a first lateral surface (in particular the surface facing the respective first fixed electrode 22a', or, equivalently, the lateral surface radially more internal with respect to the center O) that is shaped according to a suitable pattern, and a second lateral surface (in particular the surface facing the respective second fixed electrode 22b', or, equivalently, the lateral surface radially more external with respect to the center O) that is not shaped. In particular, the second lateral surface that is not shaped corresponds to an arc of circumference, whilst the first lateral surface that is shaped has a undulate, substantially sinusoidal, profile (as highlighted by the top plan view in the aforesaid FIGS. 10, 11a, and 11b).

Furthermore, whereas the second fixed electrode 22b' (radially more external) has both of the lateral surfaces that are not shaped, the first fixed electrode 22a' (radially more internal) has both of the lateral surfaces shaped, in particular having one and the same sinusoidal profile, substantially corresponding to the sinusoidal profile of the first lateral surface of the mobile electrode 20'.

In use, the centrifugal acceleration acting on each mobile mass 15a', 15b', causes (as shown by the arrows) an undesired approach (in so far as it is not associated with the movement of detection of an angular acceleration) of each mobile electrode 20' towards the corresponding second fixed electrode 22b', and a corresponding displacement of the same mobile electrode 20' away from the corresponding first fixed electrode 22a', with a consequent decrease of capacitance of the first sensing capacitor $C_1$, and an increase of capacitance of the second sensing capacitor $C_2$ (the increase being greater, in a known way, than the aforesaid decrease, given the non-linearity of the relation between capacitance and distance between the electrodes). However, the movement of rotation of the driving mass 3 also causes a circumferential displacement of the mobile electrode 20' with respect to the fixed electrodes 22a', 22b' (as shown by the arrows). Given the suitable shaping of the lateral surfaces of the electrodes constituting its plates, this circumferential displacement causes a total capacitive variation of the first sensing capacitor $C_1$ (in particular a capacitive increase thereof due to a net approach between the plates) such as to equal and compensate for the variations of the second sensing capacitor $C_2$ due to the contribution of the centrifugal acceleration. Furthermore, the frequency contribution of the capacitive variation due to the shaping of the electrodes substantially corresponds to the frequency contribution due to the centrifugal acceleration (which, as indicated previously, has a frequency that is twice the detection frequency) so as to enable an effective compensation for the resulting capacitive variations. In other words, via the aforesaid shaping, it is possible to generate a capacitive difference between the sensing capacitors (a difference that is then processed by the reading electronics), which remains substantially constant in the absence of a Coriolis acceleration and thus of an angular acceleration to be detected.

Advantageously, also thanks to the fact that the value of capacitance of the second sensing capacitor $C_2$ is not affected by the circumferential displacement of the mobile electrode 20' due to the rotary driving motion, it is easy, via an appropriate mathematical model and appropriate computing algorithms, to determine the shaping parameters (in particular the parameters of the sinusoidal profile, in terms of amplitude and/or period) that allows to obtain a minimization of the capacitive difference $\Delta C$ between the sensing capacitors $C_1$, $C_2$ due to the centrifugal acceleration. For example, an algorithm (of a known type, here not described in detail herein) of numeric integration of the capacitive variations over the entire surface of the electrodes may be used for this purpose, to determine the parameters of the geometrical shape of the electrodes such as to minimize the capacitive difference $\Delta C$.

Figure 12A:
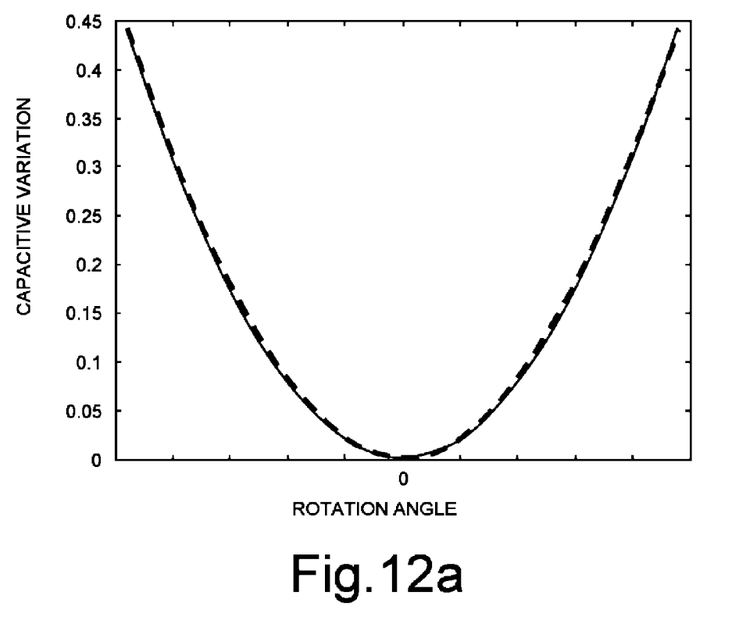
FIGS. 12a and 12b show plots of electrical quantities in the gyroscope of FIG. 9.
Figure 12B:
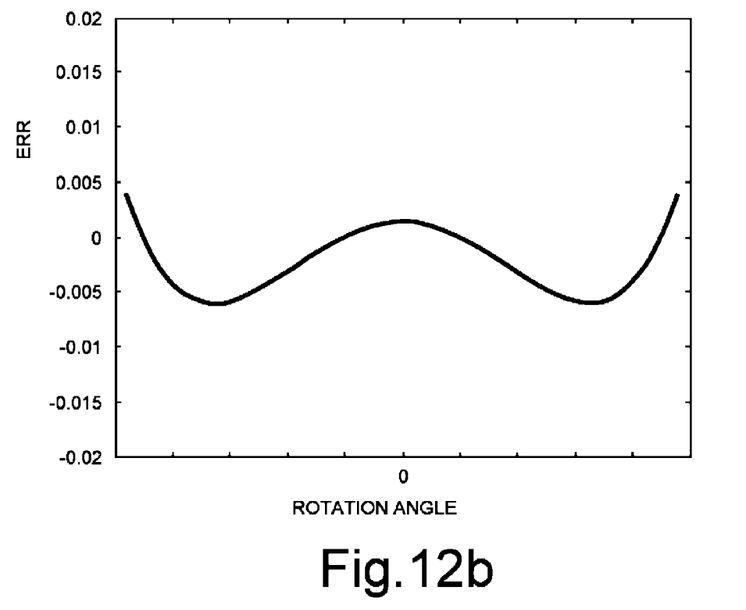

In FIG. 12a, the capacitive variation associated to the mobile electrode 20' during the driving motion on account of the sole centrifugal acceleration is represented with a solid line, and the capacitive variation associated to the same mobile electrode 20' caused by the sole shaping of the electrodes previously described is represented with a dashed line. As may be readily noted, the aforesaid capacitive variations are substantially equivalent. Consequently, as illustrated in FIG. 12b, the compensation error on the resulting capacitive variation (capacitive difference $\Delta C$, given by the difference of the aforesaid capacitive variations) is, thanks to this intrinsic mechanical compensation, substantially zero or in any case negligible. In particular, it may be shown that this intrinsic compensation enables reduction of the noise effect of the centrifugal acceleration by a factor equal to 100.

Although it is clear, it is emphasized that the sinusoidal shape described previously is not the only shape possible to obtain the aforesaid effect, and that other geometrical shapes are equally possible, the parameters of which may again be determined via numeric algorithms (for example, there may be envisaged a shaping with a saw-tooth profile).

A further embodiment of the present disclosure envisages provision of a biaxial or triaxial gyroscope by adding to the previously described detection structure for sensing yaw angular accelerations, a detection structure for sensing pitch and/or roll angular accelerations, substantially as described in the aforesaid patent applications filed in the name of the present applicant.

Figure 13:
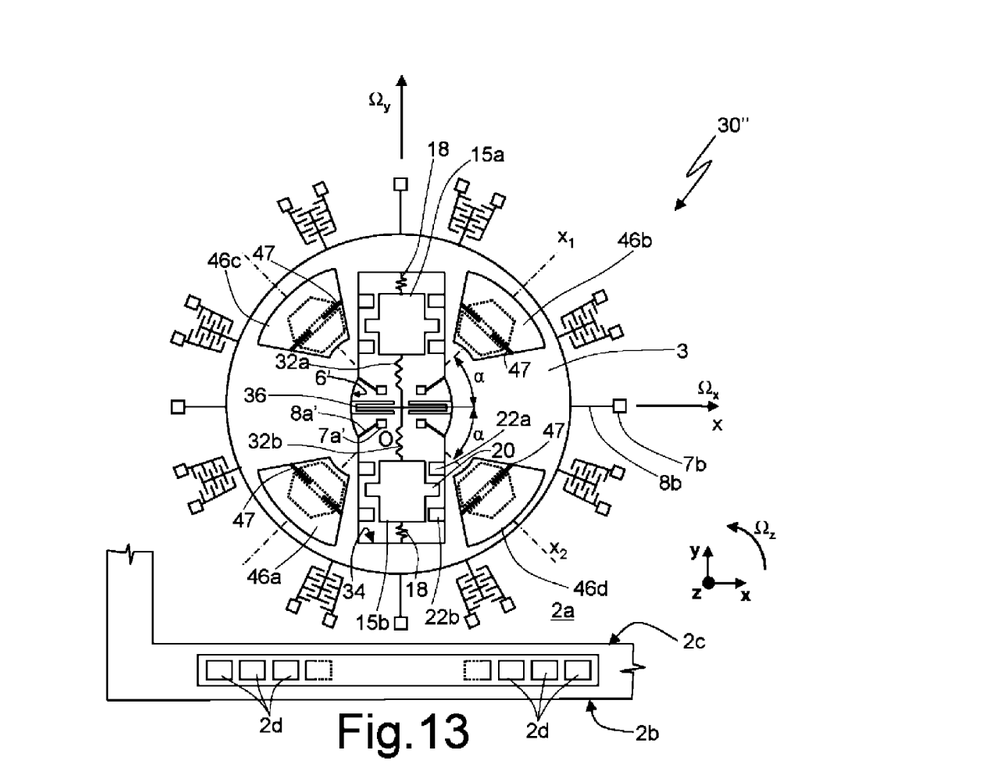
FIG. 13 shows a further embodiment of the present disclosure, corresponding to a triaxial gyroscope.

An example of a triaxial gyroscope thus obtained is shown in FIG. 13, where it is designated by the reference number 30".

In brief (but reference may be made to the aforesaid patent applications for further details), the gyroscope 30" (illustrated schematically) in this case comprises a first pair and a second pair of further sensing masses 46a-46b and 46c-46d, housed within respective through openings in the driving mass 3 and connected thereto via respective elastic elements 47.

The further sensing masses 46a, 46b of the first pair are aligned in a first diametric direction $x_1$, inclined with respect to the first horizontal axis x of the die 2 by an angle of inclination α (considered in a counterclockwise direction), the value of which is comprised between 40° and 50° and preferably is 45°. Likewise, the further sensing masses 46c, 46d of the second pair are aligned in a second diametric direction $x_2$, substantially orthogonal to the first diametric direction $x_1$, and inclined with respect to the first horizontal axis x by the same angle of inclination a (considered in this case in an opposite direction, i.e., clockwise). Furthermore, the further sensing masses 46a, 46b of the first pair are symmetrical to corresponding further sensing masses 46d, 46c of the second pair, with respect to an axis of symmetry of the die pads 2d (coinciding with the second horizontal axis y). For example, the further sensing masses 46a-46d are, in plan view, substantially shaped like a radial annulus sector, and constitute acceleration sensors with axis parallel to the vertical axis z. In use, an angular acceleration of pitch or roll generates a Coriolis force on the further sensing masses 46a-46d such as to cause a rotation thereof out of the plane of the sensor xy, and an approach towards (or a moving away from) respective detection electrodes facing them and set on the substrate 2a (represented with a dashed line).

Further anchorages 7b are also shown in FIG. 13, which are set outside the driving mass 3; the driving mass is anchored to the substrate 2a via these further anchorages 7b, to which it is connected by means of further elastic anchorage elements 8b.

Figure 14:
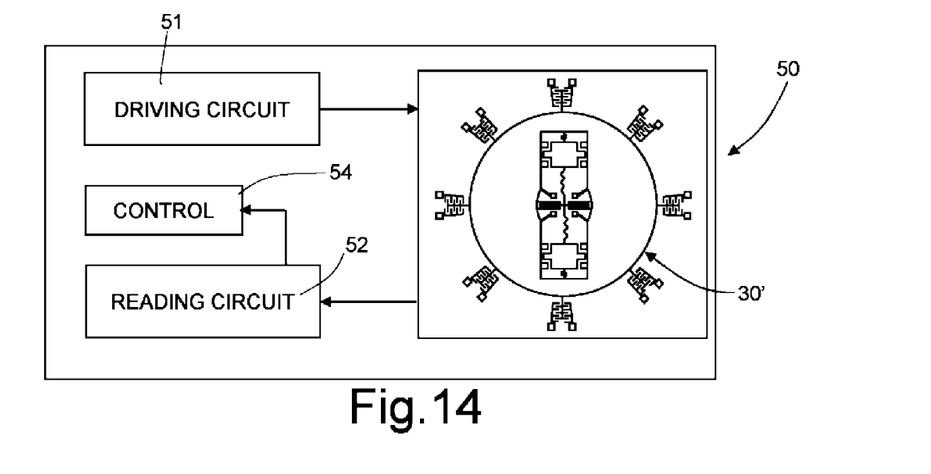
FIG. 14 shows a simplified block diagram of an electronic device provided with a microelectromechanical gyroscope according to the present disclosure.

FIG. 14 illustrates an electronic device 50 comprising the microelectromechanical gyroscope 30' (or 30") previously described. The electronic device 50 can advantageously be used in a plurality of electronic systems, for example, in inertial navigation systems, in automotive systems or in systems of a portable type, such as, for example: a personal digital assistant (PDA); a portable computer; a cell phone; a digital audio player; a photographic camera or video-camera; or further systems capable of processing, storing, transmitting, and receiving signals and information.

The electronic device 50 further comprises: a driving circuit 51, operatively coupled to the driving assembly 4 for imparting the rotary driving movement on the driving mass 3 and supplying biasing signals to the microelectromechanical structures (in a per-se known manner, here not illustrated in detail); a reading circuit 52, operatively coupled to the sensing capacitors $C_1$, $C_2$ of the sensing masses, for detecting the amount of displacement of the sensing masses and hence determining the angular velocity acting upon the structure; and an electronic control unit 54, for example, of a microprocessor type, connected to the reading circuit 52, and designed to supervise the general operation of the electronic device 50, for example, on the basis of the angular velocities detected and determined.

The advantages of the microelectromechanical gyroscope provided according to the present disclosure are clear from the foregoing description.

In particular, it is again emphasized that mechanical coupling via elastic elements of the sensing masses for detecting yaw angular accelerations enables rejection of external acceleration noise (for example, due to environmental noise or other source of noise), even in the presence of process spread.

The particular shaping pattern of the detection electrodes enables compensation and minimization of the effects of the centrifugal acceleration due to the rotary driving movement. In particular, these effects are intrinsically compensated for without requiring any particular additional arrangements within the reading electronics.

Furthermore, the detection structure for detecting yaw accelerations has an architecture that is altogether compatible with a biaxial or triaxial gyroscope, enabling its integration with structures for detecting pitch and/or roll angular accelerations. Finally, it is clear that modifications and variations may be made to what has been described and illustrated herein, without thereby departing from the scope of the present disclosure.

In particular, it is clear that modifications can be envisaged to the configuration of some of the structural elements of the gyroscope. For example, the sensing masses 15a", 15b" for detection of yaw angular accelerations can be aligned in a different direction in the plane of the sensor xy (for example, along the first horizontal axis x); a different conformation of the elastic coupling elements 32a, 32b and of the connection body 35 may be envisaged; it is possible to shape according to a desired pattern both the first and the second fixed electrodes 22a', 22b', or else it is possible to shape only the radially-more-external second fixed electrodes 22b'; both the first and the second fixed electrodes 22a', 22b' can possibly extend on the outside of the corresponding sensing masses 15a', 15b', in a way substantially similar to what is illustrated with reference to FIG. 5. More in general, the driving mass 3 may have a different shape, different from the circular one, such as a closed generically polygonal shape, as likewise the shape of the frame 2b of the die 2 may be different.

Furthermore, the displacement of the sensing masses can be determined with techniques different from the capacitive one, for example, by means of detection of a magnetic force, and the twisting moment for causing oscillation of the driving mass with rotary movement can be generated in a different way, for example, by means of parallel-plate electrodes, or else by magnetic actuation.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A microelectromechanical device, comprising:
a substrate;
a first electrode suspended above the substrate, the first electrode having a first patterned side and a second patterned side opposite to the first patterned side, the first patterned side having a different pattern than the second patterned side;
a second electrode suspended above the substrate, the second electrode having a first patterned side that corresponds to and faces the first patterned side of the first electrode;
a third electrode suspended above the substrate, the third electrode having a first patterned side that corresponds to and faces the second patterned side of the first electrode.

2. The device of claim 1 wherein the first and second electrode form a first capacitor and the first and third electrode form a second capacitor.

3. The device of claim 1 wherein the first, second, and third electrodes are curved and a first distance between the first electrode and the second electrode is consistent along a length of the first and second electrodes and a second distance between the first and third electrode is consistent along a length of the first and third electrode.

4. The device of claim 1, further comprising a sensing mass, the sensing mass having an opening, the first, second, and third electrodes being positioned in the opening.

5. The device of claim 4 wherein the first electrode is mobile and the second and third electrodes are fixed.

6. The device of claim 5 wherein the second and third electrodes are fixed to the substrate and the first electrode is fixed to a wall of the opening.

7. The device of claim 4 wherein the opening in sensing mass has a curvature and the first, second, and third electrodes have the same curvature.

8. The device of claim 1 wherein the second electrode has a second patterned side that corresponds to the first patterned side of the second electrode.

9. The device of claim 1 wherein the third electrode has a second patterned side that corresponds to the first patterned side of the third electrode.

10. A device, comprising:
a substrate;
a driving mass having a center point, the driving mass including a first opening centered about the center point;
a first and second sensing mass positioned in the first opening on opposing sides of the center point, the first and second sensing mass having a second and third opening, respectively, each of the second and third opening including:
a first mobile electrode coupled to the first sensing mass, the first mobile electrode having a first edge with a first pattern and a second edge, opposite to the first edge, having a second pattern that is different from the first pattern;

a first fixed electrode coupled to the substrate, the first fixed electrode having an edge that faces the first edge of the first mobile electrode and matches the first pattern;

a second fixed electrode coupled to the substrate, the second fixed electrode having an edge that faces the second edge of the first mobile electrode and matches the second pattern.

11. The device of claim 10 wherein the first mobile electrode and the first and second fixed electrode have a curvature.

12. The device of claim 11 wherein the first mobile electrode and the first and second fixed electrode are parallel to walls of the second and third openings, the walls of the second and third opening having the same curvature.

13. The device of claim 10 wherein the first fixed electrode is closer to the center point than the second fixed electrode and the first mobile electrode is between the first fixed electrode and the second fixed electrode.

14. The device of claim 10 wherein the second and third opening include a first group of electrodes and a second group of electrodes, the first group of electrodes including the first mobile electrode and the first and second fixed electrode, the second group of electrodes including a second mobile electrode and a third and a fourth fixed electrode.

15. The device of claim 14 wherein second and third opening have a center line that extends through the second and third opening from the center point, the first mobile electrode being attached to a first wall of the respective opening and the second mobile electrode being attached to a second wall of the respective opening, the first wall being on an opposite side of the center line from the second wall.

16. The device of claim 15 wherein the first, second, third, and fourth fixed electrodes are fixed to the substrate closer to the center line than to the first and second walls.

17. The device of claim 10 wherein the first pattern has a smooth shape and the second pattern has a saw tooth shape.

18. The device of claim 10 wherein the first pattern has a smooth shape and the second pattern has an undulating shape.

19. A method, comprising:

forming a first mobile electrode to have a first side that has a first pattern and a second side that has a second pattern, the first pattern being different from the second pattern;

forming a first fixed electrode to have a first side that faces the first side of the first mobile electrode and matches the first pattern, the first mobile electrode and the first fixed electrode forming a first capacitor; and forming a second fixed electrode to have a first side that faces the second side of the first mobile electrode and matches the second pattern, the first mobile electrode and the second fixed electrode forming a second capacitor.

20. The method of claim 19, further comprising:

forming an opening in a sensing mass, the sensing mass being suspended over a substrate;

coupling the first fixed electrode and the second fixed electrode to the substrate;

coupling the first mobile electrode to a wall of the sensing mass.

21. The method of claim 19 wherein forming the first mobile electrode includes forming the first pattern to have a smooth contour and forming the second pattern to have an undulating contour.

* * * * *